(12) United States Patent
Magnussen et al.

(10) Patent No.: US 9,209,742 B2
(45) Date of Patent: Dec. 8, 2015

(54) METHOD FOR DETERMINING A SPATIAL ARRANGEMENT OF PHOTOVOLTAIC MODULE GROUPS IN A PHOTOVOLTAIC INSTALLATION

(75) Inventors: Bjoern Magnussen, Kassel (DE); Jens Klein, Goettingen (DE); Tobias Gunkel, Wolfhagen (DE)

(73) Assignee: SMA Solar Technology AG, Niestetal (DE)

( * ) Notice: Subject to any disclaimer, the term of this patent is extended or adjusted under 35 U.S.C. 154(b) by 1118 days.

(21) Appl. No.: 13/234,250

(22) Filed: Sep. 16, 2011

(65) Prior Publication Data

US 2012/0068687 A1 Mar. 22, 2012

(30) Foreign Application Priority Data

Sep. 16, 2010 (DE) .......................... 10 2010 037 582

(51) Int. Cl.
*G01N 27/00* (2006.01)
*H02S 50/10* (2014.01)
*H01L 31/042* (2014.01)

(52) U.S. Cl.
CPC .............. *H02S 50/10* (2014.12); *H01L 31/042* (2013.01); *Y02E 10/50* (2013.01)

(58) Field of Classification Search
None
See application file for complete search history.

(56) References Cited

U.S. PATENT DOCUMENTS

2010/0204844 A1* 8/2010 Rettger et al. ................ 700/291
2010/0309330 A1* 12/2010 Beck .......................... 348/222.1
2010/0318297 A1* 12/2010 Herzig et al. ..................... 702/3

OTHER PUBLICATIONS

May 13, 2008 Internet Archive Wayback Machine capture of: "Mapping Electrical Circuits in Your Home" by Copper Development Association; retrieved on Dec. 26, 2014, http://web.archive.org/web/20080518150630/http://www.copper.org/consumers/copperhome/HomePlan/mapping_electrical_circuits_home.html.*
Jun. 20, 2010 Internet Archive Wayback Machine capture of: "What happens if the solar panels are shaded?" by Solar Oregon; retrieved on Dec. 24, 2014, http://web.archive.org/web/20100620042740/http://solaroregon.org/residential-solar/residential-faqs/what-happens-if-the-solar-panels-are-shaded.*

* cited by examiner

*Primary Examiner* — Melissa Koval
*Assistant Examiner* — Stephen G Armstrong
(74) *Attorney, Agent, or Firm* — Eschweiler & Associates, LLC

(57) ABSTRACT

A method for determining a spatial arrangement of photovoltaic module groups in a photovoltaic installation includes measuring a sequence of values of an illumination-dependent electrical characteristic variable of different photovoltaic module groups while the photovoltaic installation is subject to light incidence with an incidence intensity which varies over time and spatially. The relative spatial arrangement of the photovoltaic module groups with respect to one another is then determined by comparing sequences of measured values associated with different photovoltaic module groups.

19 Claims, 4 Drawing Sheets

METHOD FOR DETERMINING A SPATIAL ARRANGEMENT OF PHOTOVOLTAIC MODULE GROUPS IN A PHOTOVOLTAIC INSTALLATION

REFERENCE TO RELATED APPLICATIONS

This application is a related to German Patent Application 102010037582.9, filed Sep. 16, 2010, and is incorporated by reference in its entirety.

FIELD

The invention relates to a method for determining a spatial arrangement of photovoltaic module groups in a photovoltaic installation, in particular a photovoltaic installation having a multiplicity of photovoltaic module groups. The invention also relates to a photovoltaic installation having a device for determining a spatial arrangement of photovoltaic module groups.

BACKGROUND

Photovoltaic installations, in particular rural installations, may have a large number of photovoltaic modules, a plurality of which, generally adjacent, are in each case combined to form photovoltaic module groups. The modules in a group are typically connected in series, for example, to form a so-called string.

Each group within the installation may have its own associated inverter for converting the direct current that is produced to alternating current for feeding into a supply system. Alternatively, a plurality of groups can be connected together to one inverter, which is designed for a correspondingly higher power. In a situation such as this, the inverter may have an AC voltage circuit but may have a plurality of input circuits on the DC voltage side for connection to the individual groups.

When planning a relatively large rural installation, the aim is normally to achieve a certain regularity in the geometric arrangement of the individual modules and strings, and their association with the inverters, which are distributed within the rural installation. However, the outline of a rural installation generally is not in the form of a simple geometric figure, for example a rectangle. Particularly in the edge area of a rural installation, or else when extensions or repairs are carried out retrospectively, the regularity is, however, frequently interrupted. This means that, in the case of many relatively large installations, the precise position of individual groups of modules that are associated with a specific inverter or inverter circuit is unknown.

A fault situation, for example a failed string or a string whose power has decreased, is generally identified by monitoring devices that are normally provided in the inverters, and is also signalled to a control center via a data network. In this case, a serial number of the inverter is generally output, but this provides no indication of where the inverter is installed. The serial number is frequently also not recorded on an installation plan, since it is not yet known when the installation plan is produced during the installation planning. It is therefore often complex to locate an inverter. Rectification of the fault within a stream or its wiring additionally requires the location of the string to be found, although, without an association plan, this is possible only by tedious tracing of the wiring between an inverter and the connected elements. This tracing is also complex and subject to errors.

SUMMARY

One embodiment of the present invention is therefore to provide a reliable method for determining the spatial arrangement of photovoltaic module groups in a photovoltaic installation.

According to one aspect, the method for determining a spatial arrangement of photovoltaic module groups in a photovoltaic installation has the following steps. A sequence of measured values of an illumination-dependent electrical characteristic variable of different photovoltaic module groups is measured while the photovoltaic installation is subject to light incidence with an incidence intensity which varies over time and spatially. The relative spatial arrangement of the photovoltaic module groups with respect to one another is then determined by comparing sequences of measured values associated with different photovoltaic module groups.

According to the invention, the measured values of an illumination-dependent electrical characteristic variable, for example from current, voltage or power measurements on the photovoltaic module groups, are used to determine the spatial arrangement of the photovoltaic module groups with respect to another. An installation topology plan can thus be produced from measured values that are available in any case, and are normally also recorded, during operation of the installation.

In one advantageous embodiment or refinement of the method, the step of comparing sequences of measured values comprises a determination of a similarity of the sequences of measured values. Shadowing events, for example induced by moving clouds, lead to a characteristic time dependence of the sequences of measured values. The degree of similarity between sequences of measured values is usually correlated with the spatial arrangement of the photovoltaic module groups. For example, the closer the photovoltaic module groups are positioned with respect to each other, the higher the degree of similarity for the sequences of measured values will be.

In a further advantageous embodiment or refinement of the method, the step of comparing sequences of measured values comprises a determination of time shifts between sequences of measured values. That way, sequences of measured values can be correlated with each other in a simple manner. The amount of data to be processed can advantageously be reduced.

In a further advantageous embodiment or refinement of the method, the incidence intensity, which varies over time and spatially, is caused by manually induced shadowing. In a further advantageous refinement of the method, the incidence intensity, which varies spatially, is caused by shadowing by clouds.

Further advantageous refinements and developments of the invention are specified in the dependent claims.

BRIEF DESCRIPTION OF THE DRAWINGS

The invention will be explained in more detail in the following text using exemplary embodiments and with the aid of four figures, in which.

DETAILED DESCRIPTION

Figure 1:
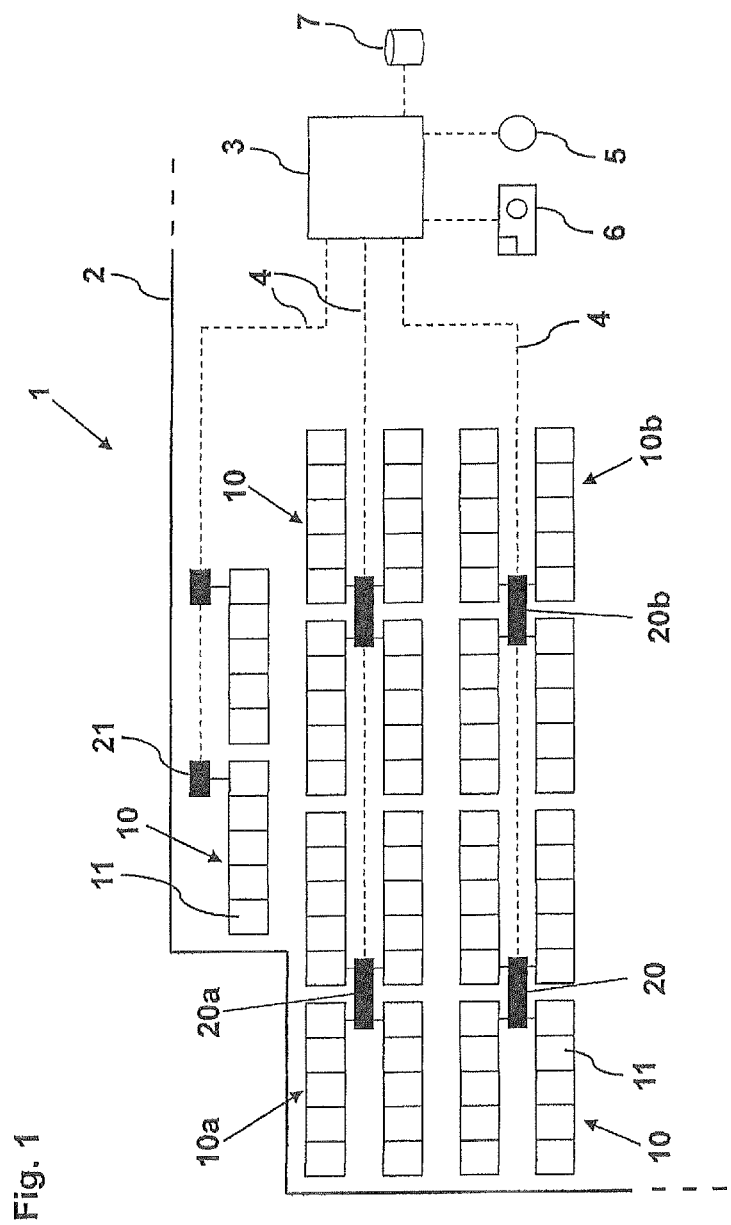
FIG. 1 shows a schematic view of a photovoltaic installation.

FIG. 1 shows a schematic view of a detail of a photovoltaic installation 1. The photovoltaic installation 1 has a multiplicity of photovoltaic module groups 10, each of which in turn comprises a plurality of photovoltaic modules 11. The photovoltaic modules 11 in each group 10 are electrically connected to one another, for example by being connected in series as so-called strings. In the following text, the term "photovoltaic" is abbreviated to "PV".

By way of example, the illustrated arrangement represents a relatively small detail of a rural or field installation that may comprise several hundred to several thousand PV module groups 10. The geometric boundary of the PV installation 1 is sketched by a boundary line 2 in the area of the illustrated PV module groups 10.

The individual PV module groups 10 are electrically connected to inverters 20, 21 which are distributed in the installation area. Likewise for clarity reasons, the figure does not show wiring on the AC side for feeding the current produced by the PV module groups 10 and converted by the inverters 20, 21 into an electrical power supply system.

As is frequently the case in relatively large installations, different inverters are used in the illustrated exemplary embodiment. By way of example, multiple-circuit inverters 20 are illustrated, which are each connected to four PV module groups 10, and single inverters 21, which are used to convert the current in each case produced by one photovoltaic element 10. For the sake of clarity, the PV module groups, PV modules and inverters are not all provided with reference symbols.

It is noted that the invention is not only suited for rural installations, but also for smaller photovoltaic installations, e.g. roof installations. A method according to the invention can as well be used in connection with photovoltaic installations that are completely or partially equipped with so-called micro-inverters that are integrated into PV modules. Accordingly, within this application a reference to PV module groups also includes groups that contain one PV module only.

The PV installation 1 furthermore comprises a device 3 for determining the spatial arrangement of the PV module groups 10. The device 3 is connected to the inverters 20, 21 via signal lines 4. The inverters 20, 21 transmit measured values of illumination-dependent electrical characteristic variables from the PV module groups 10 via the signal lines 4. In this sense, each PV module 11, or each circuit of a plurality of PV modules 11 whose characteristic variable or variables is or are recorded independently, represents a PV module group 10. The measured values are, in one embodiment, transmitted in digital form, in which case the signal lines 4 may be lines of a data network. Information relating to characteristic variables of the PV module groups 10 and of the inverters 20, 21 is normally provided by themselves via network connections, and is recorded centrally within the PV installation 1. The device 3 is therefore advantageously linked to this central recording of information from the inverters 20, 21, or is integrated therewith. However, the device 3 is not necessarily a fixed part of the photovoltaic installation 1. Alternatively, the device 3 may also be arranged remotely from the photovoltaic installation 1, or may be in the form of a mobile appliance. The mobile appliance, for example a memory card, can for this purpose be connected to the inverters 20, 21 for data recording, and may subsequently be coupled to the device 3 in order to read the data, as is also intended to be covered by the term signal lines 4.

The PV installation 1 may also have incidence sensors that are not illustrated in FIG. 1 but are arranged in the installation area. Like the PV module groups 10, the incidence sensors have illumination-dependent electrical characteristic variables. If these are recorded and are transmitted to the device 3, the incidence sensors can be treated as PV module groups 10, within the meaning of the method according to the invention, and are regarded as such for the purposes of this application. Furthermore, the device 3 is optionally connected to a weather station 5, a camera 6 and a database 7. In this case, the database 7 is not necessarily located locally in the PV installation 1 but may in this case be a database that can be accessed via a remote data transmission network, for example the Internet, or some other information source.

The inverters 20, 21 continuously record electrical characteristic variables of the PV module groups 10 connected to them, during operation. The multiple-circuit inverters 20, to each of which in the present case four PV module groups 10 are connected, are in this case able to separately record the electrical characteristic variables of the individual PV module groups 10 connected to them. Alternatively or additionally, it is also possible to provide sensor devices independently of the inverters 20, 21 for determining these electrical characteristic variables within the PV installation 1, with these being associated with individual PV module groups 10. Since, as stated, the inverters 20, 21 normally already have measurement devices for determining the electrical characteristic variables, however, it is possible to make use of this measurement device.

Relevant electrical characteristic variables are, for example, the current I produced by the PV module groups 10, or the power P that is produced. These characteristic variables of the inverters 20, 21 are typically recorded, for example every second, and can, in theory, also be transmitted to the device 3 at this measurement frequency. In the case of a large PV installation 1, this leads to a very high data rate at the device 3, as a result of which it may be desirable to reduce the amount of data. For this purpose, it is, for example, possible to define threshold values for the characteristic variables in the inverters 20, 21 or in the sensor devices, for example a specific current threshold value $I_s$ or a specific power threshold value $P_S$, a relative change threshold or a threshold value criterion matched to the respective situation (for example weather situation) for these characteristic variables. When this threshold value is overshot or undershot, an appropriate signal is transmitted to the device 3, containing, for example, the time of overshooting or undershooting. The times at which shadowing starts and ends again are determined and transmitted in this way, and are used as the basis for the subsequent evaluation. In this case, it is possible to configure the threshold values variably, for example such that they always amount to a fixed fraction of a maximum value, for example of a maximum daily value. At this point, it should be noted that the term shadowing in the remainder of the description is also intended to cover the case of not being shadowed, in an equivalent form.

In addition to the measured current or power values I, P, it is also possible alternatively to consider their rates of change (time derivatives, for example first and/or second time derivatives). In this case as well, threshold values can be used for the rates of change of the electrical characteristic variable for determining shadowing times (for example times at which the shadowing ends again). It is also possible to determine the shadowing times on the basis of maxima in the rate of change.

In order to generate signals that are as unique as possible, it may optionally also additionally be required for only those signals to be passed on in which no further signal has been detected in a suitable time period before and after this.

Figure 2:
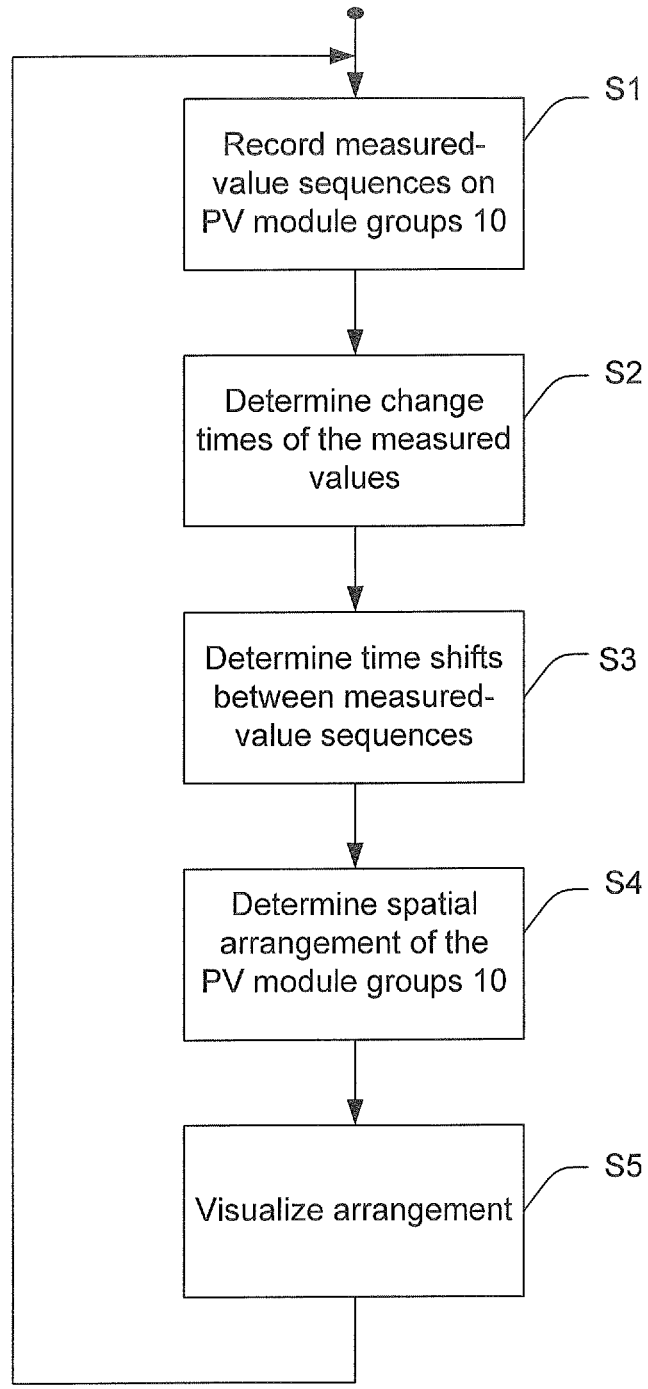
FIG. 2 shows a flowchart of a method for determining the spatial arrangement of photovoltaic module groups.

The fundamental idea of the method for determining the spatial arrangement of the PV module groups 10, that can be carried out, for example, by the PV installation 1 illustrated in FIG. 1, and in particular by the device 3, is reproduced in the form of a flowchart in FIG. 2.

In a first step S1, a sequence of measured values of an electrical characteristic variable, for example of the current I, is recorded for PV module groups 10 in a PV installation 1. In an optional second step S2, times at which the measured-value sequences change (such as shadowing times) are determined, for example by comparison with a predefined threshold value.

In a third step S3, time shifts between sequences of measured values that are associated with different PV module groups 10 are determined. These time shifts indicate the time differences at which measured-value sequences that are recorded at different PV module groups 10 have similar profiles, or, in other words, how measured-value sequences are correlated with one another in time.

In the case of the optional step S2, the time shifts can be determined by forming the difference between the change times of different PV module groups 10. However, for example, it is alternatively also possible to determine the time shift by means of a mathematical correlation function between measured-value sequences from different module groups, as a result of which there is no need to assign a specific change time to a single measured-value sequence in order to determine a time shift of a shadowing event between PV module groups 10.

In a fourth step S4, these time shifts are used to determine the relative spatial arrangement of the PV module groups 10 with respect to one another. In this context, spatial should be understood in the geometric sense and does not include any indication of the number of dimensions. However, in one embodiment the method relates to determining a two-dimensional arrangement. The specific arrangement is visualized in an optional fifth step S5, for example in the form of a topological installation plan. The method can then be carried out again, starting with the first step S1 once again, taking into account the results obtained in the previous run or runs. This iteratively improves the accuracy of the result. The accuracy of the result relates to the magnitude of the uncertainty associated with the determined positions of the PV module groups 10.

Refinements of the method will be described in more detail in the following text.

In a first refinement of the method, the incidence intensity, that varies over time and spatially, is caused by manually induced shadowing. By way of example, a shadowing flag can for this purpose be pulled successively over individual PV module groups 10 in the PV installation 1, with the geographic position of the flag support being recorded at the same time. A so-called GPS (Global Positioning System) recorder (tracker) can be used for this purpose. During this manually induced shadowing process, the device 3 records measured values of the electrical characteristic variables of the PV module groups 10. As stated further above, these may be the measurement variables themselves or else time values at which specific predetermined threshold values are overshot or undershot. For example, threshold values can be set such that they are overshot by average daytime illumination but are undershot when one of the modules 11 in a PV module group 10 is shadowed. The device 3 therefore records when each PV module group 10 was affected by the manually induced shadowing. A matching process, carried out subsequently, with the position information from the GPS tracker allows a geographic position to be associated with the individual PV module groups 10. An installation plan, a schematic topological map of the arrangement of the individual PV module groups 10, of the PV installation 1 can be produced on the basis of this information.

In a further refinement of the method, the shadowing of the PV module groups 10 is not induced manually, but use is made of naturally occurring shadowing phenomena, which lead to an incidence intensity which varies over time and spatially. Natural shadowing that leads to an incidence intensity that varies in this way is provided by clouds moving past. A further source of naturally occurring (partial-) shadowing are items in the vicinity of the PV module groups. Such items could for example be trees, towers or parts of buildings, e.g. chimneys, or the like. Such items could further be part of the PV installation itself, e.g. adjacent PV module groups or even parts of the respective PV module group itself.

In particular when applying the method to smaller PV installations such as roof installations, the use of naturally occurring shadowing phenomena, for example induced by trees or parts of a roof structure, is advantageous due to the fact that the narrow spacing of the PV module groups then leads to a incidence intensity that basically varies repetitively on a daily basis and is easy to analyze. Alternatively or additionally, the method can successfully be applied to smaller PV installations, if the measurement of the values of the illumination-dependent electrical characteristic variable is performed with a time resolution of a second or less, e.g. of 0.1 seconds.

One method based on shadowing by clouds is described in the following text, once again with reference to the PV installation 1 in FIG. 1.

Figure 3:
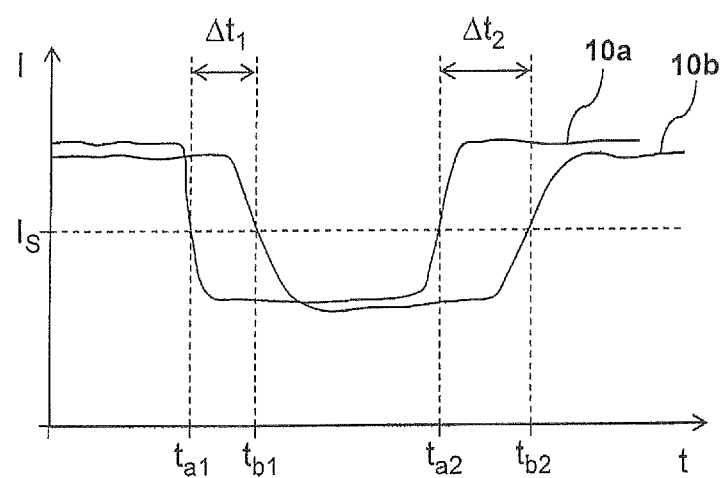
FIG. 3 shows an example of time-dependent measured values of the current of two photovoltaic module groups.

By way of example, FIG. 3 shows the profile of the current I as an illumination-dependent electrical characteristic variable of two PV module groups 10, for example the groups 10a and 10b indicated in FIG. 1, as a function of the time t. The dashed horizontal line indicates a predetermined current threshold value $I_S$, whose undershooting or overshooting results in a message being passed to the device 3 from the inverter 20a or 20b with which the corresponding group 10a, 10b is associated. The threshold value may be determined as a predetermined fixed value, as a relative reference value or dynamically taking account of the currently prevailing conditions (for example the weather conditions).

FIG. 3 shows the time-dependent current profile for a situation in which a cloud is moving over the PV installation 1 from left to right (with respect to FIG. 1). As can be seen, the shadowing associated with a front cloud boundary in the movement direction reaches the PV module group 10a first of all, and the current produced by this group 10a then falls below the current threshold value $I_S$ shown. In consequence, the multiple-circuit inverter 20a sends a message relating to this to the device 3, with the message including not only an identification of the PV module group 10a but also the time at which the threshold value was undershot, annotated $t_{a1}$ in FIG. 3. The same applies to the PV module group 10b at a time $t_{b1}$, as is signalled to the device 3 by the multiple-circuit inverter 20b.

Conversely, at the times $t_{a2}$ and $t_{b2}$, the shadowing of the PV module groups 10a, 10b ends again once the shadow of the rear end of the cloud has moved past. As can be seen in FIG. 3, the time differences $\Delta t_1 = t_{b1} - t_{a1}$ and $\Delta t_2 = t_{b2} - t_{a2}$ are not the same in the present case. On the one hand, this may be because the front end of the cloud is aligned differently to the rear end of the cloud, or because the speed of the cloud has changed during its movement over the PV installation 1.

Even if parameters of a single cloud, such as its movement direction, its movement speed and the shape and/or alignment of the front and rear ends are unknown, information about the arrangement of the PV module groups 10 within the PV installation 1 can be obtained from the measured values obtained, for example by statistical averaging over a multiplicity of shadowing events. For example, the situation generally occurs independently of these parameters in which PV module groups which are located at the edge, that is to say for example adjacent to the boundary line 2 shown in FIG. 1, each being subject to shadowing before groups located closer to the centre.

Furthermore, since, in very rare cases, cloud fronts are aligned precisely parallel to a side edge of the PV installation 1, there is a high probability of PV module groups located at corners, for example the group 10a in the exemplary embodiment shown in FIG. 1, will be affected by shadowing even before other PV module groups 10 which are located at the edge. Furthermore, it can frequently be assumed to a good approximation that the wind direction does not change, or changes only slightly, within a specific time period, for example one day. All of the information gathered over the course of this time period can therefore be used, for example, in order to identify PV module groups 10 that are located at the corners and at the edges and—initially, of course, only with respect to the movement direction of the clouds—to position them provisionally relative to one another in a map of the PV installation 1. PV module groups that are located at the edges of a PV installation are also distinguished by typically being subject to less shadowing by adjacent PV module groups in the morning and evening hours than PV module groups that are located further in the interior. This, too, can be used to identify them.

Figure 4:
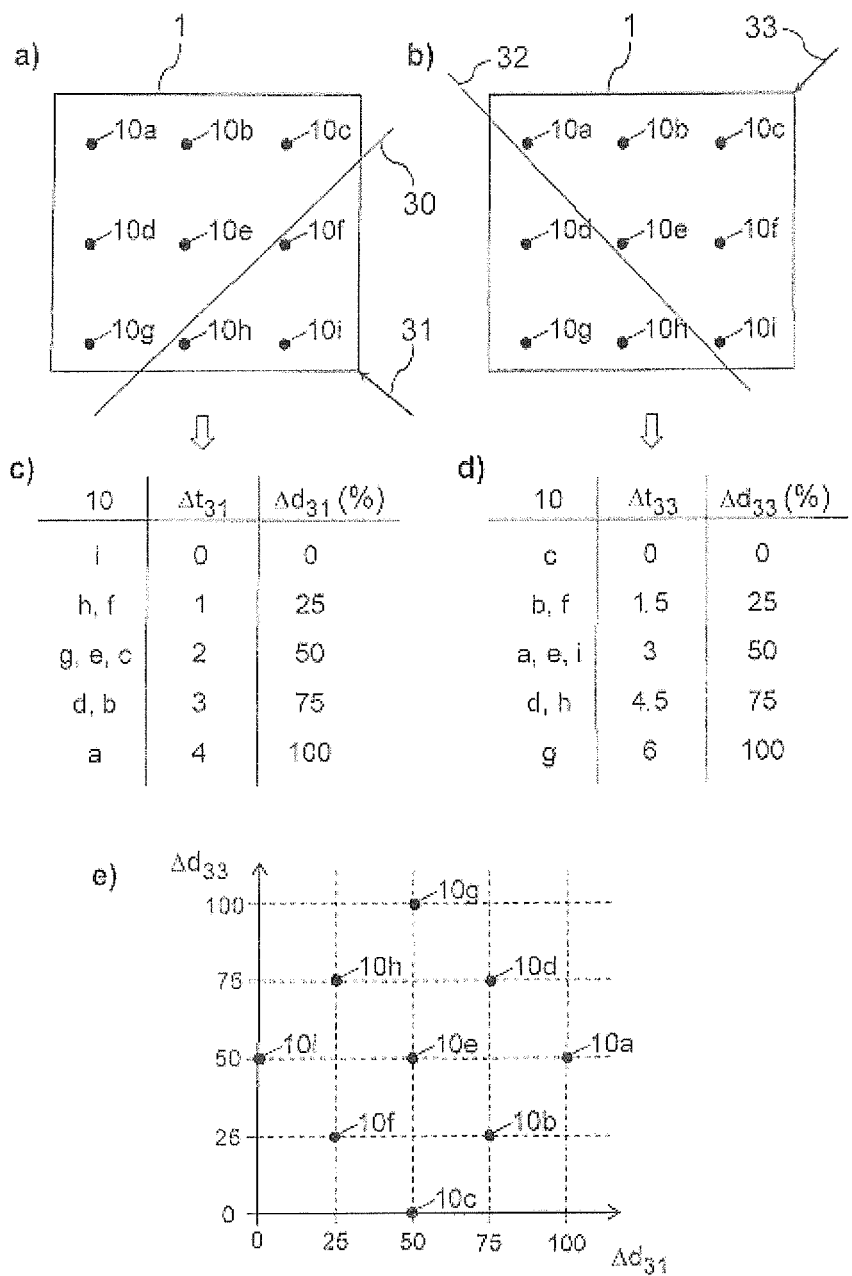
FIG. 4 shows schematic illustrations of a photovoltaic installation and of determined shadowing times in order to illustrate a further embodiment or refinement of the method.

By way of example, the 5 sub-figures a) to e) in FIG. 4 show how a first approximated plan of the installation topology can be produced by evaluation of just two different shadowing events as cloud fronts pass over. The evaluation is based on two shadowing events, in each of which a single PV module group, but a different PV module group for the two events, experiences shadowing first of all.

By way of example, FIGS. 4a, 4b show a PV installation 1 at two different times, comprising nine PV module groups 10a to 10i, that are arranged in a regular pattern in three rows and three columns. A shadowing time can be recorded separately for each of the PV module groups 10.

By way of example, a first shadow front 30 of a cloud is crossing over the PV installation 1 in FIG. 4a, moving at a specific speed in a first direction 31. At the illustrated time, the shadow front 30 has just reached the PV module groups 10h and 10f. FIG. 4b shows the PV installation 1 at a different time, at which a second shadow front 32 is crossing over the PV installation 1 in a second direction 33 and the PV module groups 10a, 10e, and 10i have just been shadowed.

FIGS. 4c, 4d each use a table to list, for the two shadowing events illustrated in the upper part, the time sequence Δt (centre column) in which the individual PV module groups 10 (left-hand column) experience shadowing by the corresponding shadow front 30, 32. In the right-hand column of the tables, the time interval Δt is in each case transferred to a position Δd relative to the extent of the PV installation 1 in the corresponding direction 31 or 33 of the respective movement of the shadow fronts 30 and 32. For this purpose, the greatest time interval is set to be equal to a position Δd=100%.

In FIG. 4e, the intervals found are entered in pairs for each PV module group 10 into a coordinate system. By way of example, the position of the PV module group 10h is entered with the relative positions (25, 75) that have been found as coordinates. This allows a first provisional position map to be produced from the shadowing times, on which position map the installation topology is reproduced, projected onto the directions 31, 33 on which this is based.

The normalization to a value range of 0 to 100% for the relative positions results in the method being independent of the speed at which the shadow fronts 30, 32 are moving over the PV installation 1. In consequence, determined interval details are therefore, of course, likewise only relative and not absolute details. However, since the absolute dimensions of a PV installation 1 are normally known, the relative intervals found can be appropriately scaled.

In order to simplify the illustration, shadow fronts 30 and 32 were chosen in the example, running essentially diagonally with respect to the regular alignment of the PV module groups 10. For this reason, PV module groups 10 that are located on the diagonals in the illustrated example experience shadowing at the same time. In addition, the shadow fronts 30 and 32 are aligned diagonally with respect to one another. However, the method can likewise be carried out with a shadow front with any alignment, in which case the resultant installation topology plan would then be distorted, in a corresponding manner to a parallelogram.

A provisional installation topology plan such as this can subsequently be successively improved by including further measured values of shadowing times, for example as is described in the following text.

First of all, a start position is determined for each PV module group 10 as the current positions of the PV module groups 10 in an installation topology plan. This can be performed either in the same way as in a previous process, such as that described in conjunction with FIG. 4, or random start positions can be chosen. Furthermore, a geometric preferred distance is defined for each pair of two PV module groups 10, and is first of all initialized to a start value (preferably with a tendency to become small). For example, the lengths of the shortest extent of one of the PV module groups 10 that occurs within the PV installation 1 can be used as the start value.

The preferred distance is then modified in accordance with the following rules for all the pairs, for each shadow caused by a cloud moving past. If shadowing occurs at a short time interval for two PV module groups in a pair, this results in the deduction that the distance between the groups is relatively short. The magnitude of the distance can be estimated on the basis of a wind speed that is presupposed to be known. If the distance estimated in this way is shorter than the preferred distance associated with the pair, the preferred distance is slightly reduced. However, if a long time interval is found in the shadowing for two PV module groups in a pair, a long distance is deduced. If this distance is greater than the associated stored preferred distance, then the preferred distance is increased to the currently determined distance.

In this case, it is possible not to carry out the corresponding corrections to the distances whenever a cloud moves past, but to carry out a certain number of distance determination processes and to use only selected ones of these distance determination processes for correction of the stored distances. By way of example, it is possible to choose from a group of distance determinations only that one which has led to the third-greatest distance values. Two spurious measurements, that indicate a high probability of a tendency in the direction of excessively large values, are therefore ignored. Nevertheless, a measurement with a tendency to distances that are determined as being rather large is used for the distance correction, and this is more suitable for allowing upper correction of the start distances, that were initially chosen to be too short, in the direction of the actual values.

Finally, the positions of the PV module groups 10 in the installation topology plan are varied so as to optimize a quality criterion that is based on a comparison of the stored preferred distances with those resulting from the installation topology plan. By way of example, the quality criterion may be formed by the sum (for all the pairs) of the differences between the preferred distances and the installation topology plan distances. A quality criterion such as this can then be minimized in the position optimization process.

In this case, a disturbance variable can be used, via which the position of the PV module groups is offset by a random distance in a random direction, with the offset distance being restricted by a maximum distance. During the position optimization process, the magnitude of the maximum distance is reduced in steps from a predetermined initial value to the value zero. Such optimization under the influence of a disturbance variable is also known as simulated annealing and prevents the quality criterion from being trapped at a local minimum. An optimization process based on different start positions can be carried out, using the same distance data, for checking purposes. Different final positions in different runs of the optimization process indicate that the distances have still not been converted correctly to positions and indicate, for example, that the initial value for the disturbance variable should be increased. Methods known in statistics can be applied in order to exclude extreme values (outlier), i.e. final positions that differ considerably from other final positions, from further processing.

It is also possible to employ a back-projection method in order to successively improve a plan of the installation topology. Starting from a provisional plan, a probable movement direction and speed of the clouds can, conversely, be extracted from measured values of the electrical characteristic variable for a next time period, for example a next day. Further measurements of shadowing times can be used to readjust the positions of PV module groups 10, using this movement direction and speed. This results in an iterative back-projection method which creates an increasingly more accurate installation topology plan, initially starting without any further information therefrom, with the positions of the individual PV module groups 10. In the process, the positions of the PV module groups 10 located further in the interior of the PV installation 1 can also gradually be determined, analogously.

It is possible to unambiguously derive a sequence of the values of the illumination-dependent electrical characteristic variable if the topology of a PV installation is known. However, the functional dependence is not bijective. The inverse task, i.e. the determination of a topology from a given sequence of values of the illumination-dependent electrical characteristic variable, cannot be solved analytically. This fact is addressed by the position optimization process and the back-projection method described above.

Additionally or alternatively, information relating to the movement direction and speed of the clouds obtained from other information sources can also be used for position determination, in further refinements of the method. For example, a wind direction and speed determined by the weather station 5 illustrated in FIG. 1 can be regarded as a good approximation to the movement direction and speed of the clouds. Furthermore, information relating to the movement direction and speed of the clouds and additionally relating to the shape of the cloud edges can also be obtained by means of the camera 6, which is linked to the device 3 and photographs the sky. Finally, it is also feasible to use externally available weather information. This is indicated in FIG. 1 by a database 7 which, for example, can be checked via the Internet.

In the back-projection method described above, the definition of the time period within which essentially constant wind conditions, and therefore wind movement speed and direction, are assumed is quoted, for example, as one day. Because of the long pause during the night, in which on the one hand the method cannot be carried out and on the other hand the probability of a change in the weather is high, a day in this context represents a time unit which is worthwhile with regard to the method and meteorologically. However, particularly if additional information is available relating to the movement direction and speed of the clouds directly (for example via the camera 6) or indirectly via the wind conditions (for example via the weather station 5), this time period may, however, of course also be chosen to be shorter.

In addition to the method described above, other methods can also be used in order to deduce the spatial arrangement of the PV module groups 10 from the measurement data obtained. For example, correlation functions can be formed for all combinationally possible pairs of two PV module groups 10. If the measured-value changes caused by the shadowing have a high correlation independently of the cloud movement direction and speed, these must necessarily be elements located close to one another. If, in contrast, the correlation indicates major fluctuations, that is to say not only very high correlation values occur but also situations in which shadowing occurs in uncorrelated form, the corresponding elements are far apart from one another. The fluctuation in the correlation is then related to the wind direction and the alignment of the cloud front. If a cloud front is moving parallel to the line connecting two PV module groups 10, the shadowing occurs in a correlated form, even if the PV module groups 10 are far apart from one another. If, in contrast, the cloud front is moving in the direction of the line connecting the two PV module groups, the shadowing becomes more uncorrelated the further the two elements are apart from one another. The distance between two respective PV module groups 10 can in each case be determined in pairs from such a correlation analysis, even quantitatively if the speed of movement of the clouds is known. A topology that conforms with the distance values determined in pairs can be derived by iterative or algorithmic methods.

It is also feasible to use measurements of the magnitude of an electrical characteristic variable during cloud shadowing. Clouds do not have a standard thickness profile or light absorption profile over their extent. The time profile of the residual brightness during shadowing reflects the light absorption profile in a strip of the cloud along the direction in which it is moving past. If similar light absorption profiles are observed for two PV module groups 10, there is a high probability that these two PV module groups 10 are positioned close to one another. In contrast, if different light absorption profiles are observed, this indicates that the two PV module groups 10 are further apart. For determining the topology or a PV installation, such comparison of light absorption profiles can be combined with or can be used as an alternative to the above described method of analyzing time-shifts.

In addition to the two described methods, further methods can be used, for example based on genetic algorithms or neural networks, or based on probability maps. In addition, in these cases, an iterative process is additionally possible, in order to reduce uncertainties in the position determination in steps.

In further refinements, the determined measured values and/or cloud movement directions and speeds determined at specific times can also be stored, in order to be available for subsequent iterations or further evaluations. In further refinements, it is feasible to preset known positions of individual PV module groups 10. The measured values from groups 10 such as these can then advantageously be used to determine cloud movement directions and speeds. The same effect can also be achieved with illumination sensors that are arranged at known positions within the PV installation 1 and provide the measured values relating to the incidence intensity, that are processed by the device 3 in the same manner as the measured values from PV module groups 10 whose position is known. At least three such illumination sensors are advantageously used in the edge area of the PV installation 1, covering a triangle (for example an isosceles or equilateral triangle) which as far as possible has an adequate extent in all the cloud movement directions that occur.

In a further refinement, it is possible to take known positions of inverters into account to determine the position of the PV module groups. Inverters are usually arranged in such a manner that the total loss due to the resistances of the DC-lines that connect PV module groups and inverters is minimized. This design principle can accordingly be used to assess (possible) topologies determined in the course of the method according to the invention. This can, for example, be used to accelerate iterative optimization processes.

In a further refinement, it is possible to determine not only the position of the PV module groups 10 but also their extent. The extent of the module groups 10 has a direct influence on the range of a decrease or increase in the recorded electrical characteristic variable, thus allowing statements to be made about the lateral extent of the module groups in the respective cloud movement direction, from an analysis of these transition ranges. If a plurality of movement directions are considered, this results in information about the shape and area extent of the module groups 10 being considered.

In one embodiment of this analysis, the different positions which originate from different measurements are no longer necessarily considered as a disturbance or error but as an effect of the PV module groups 10 having an extent which is not in the form of a point. The shape of the PV module groups 10 is likewise obtained in this way.

It is apparent that the methods described can not only be applied to complete PV installations, but also to parts of a PV installation.

The invention claimed is:

1. A method for determining a spatial arrangement of photovoltaic module groups in a photovoltaic installation, comprising:
measuring a sequence of values of an illumination-dependent electrical characteristic variable of different photovoltaic module groups while the photovoltaic installation is subject to light incidence with an incidence intensity that varies over time and spatially; and
determining a relative spatial arrangement of the different photovoltaic module groups with respect to one another by comparing sequences of measured values associated with different photovoltaic module groups,
wherein comparing the sequences of measured values further comprises determining time shifts between the sequences of measured values of the different photovoltaic module groups.

2. The method according to claim 1, wherein comparing the sequences of measured values comprises determining a similarity of the sequences of measured values.

3. The method according to claim 1, wherein determining the time shifts comprises determining shadowing times of the different photovoltaic module groups, and wherein the time shifts are determined as a difference between the shadowing times of different photovoltaic module groups.

4. The method according to claim 3, wherein the shadowing times are determined by means of a threshold value criterion for the electrical characteristic variable or for a rate of change of the characteristic variable.

5. The method according to claim 1, wherein determining the time shifts comprises comparing the sequences of measured values from different photovoltaic module groups, wherein the determined time shift corresponds to a relative time offset between the sequences, for which there is a minimum discrepancy between the sequences of measured values.

6. The method according to claim 1, wherein determining the time shifts comprises comparing the sequences of measured values from different photovoltaic module groups with a model of sequences of measured values based on an assumed spatial arrangement of the photovoltaic module groups.

7. The method according to claim 1, wherein the illumination-dependent electrical characteristic variable is a current produced by the photovoltaic module group, a power that is produced by the photovoltaic module group, or a voltage that is produced by the photovoltaic module group.

8. The method according to claim 1, wherein the illumination-dependent electrical characteristic variable of the photovoltaic module group is measured at least for a part of the photovoltaic module group within an inverter to which the corresponding photovoltaic module group is connected.

9. The method according to claim 1, wherein the photovoltaic module group is a photovoltaic module or an arrangement of a plurality of connected photovoltaic modules.

10. The method according to claim 1, wherein the incidence intensity, that varies over time and spatially, is caused by manually induced shadowing.

11. The method according to claim 1, wherein the incidence intensity, that varies over time and spatially, is caused by shadowing by clouds.

12. The method according to claim 1, wherein the incidence intensity, that varies over time and spatially, is caused by a partial shadowing by a stationary item.

13. The method according to claim 12, wherein the stationary item is a part of one of the photovoltaic module groups.

14. The method according to claim 1, wherein one or more of the photovoltaic module groups has or have an already known position within the photovoltaic installation.

15. The method according to claim 1, wherein the determination of the spatial arrangement of the photovoltaic module groups takes into account weather data.

16. The method according to claim 1, wherein a spatial extent of a photovoltaic module group is determined from the sequence of measured values associated with the photovoltaic module group.

17. The method according to claim 1, wherein determining the spatial arrangement of the photovoltaic module groups further takes account of a plan of a spatial arrangement of inverters.

18. The method according to claim 1, wherein the photovoltaic installation delivers power to a grid, and wherein the photovoltaic installation comprises a spatial arrangement of a plurality of photovoltaic module groups.

19. A photovoltaic installation having a device for determining a spatial arrangement of photovoltaic module groups, the device comprising:
a measurement unit configured to measure a sequence of values of an illumination-dependent electrical characteristic variable of different photovoltaic module groups while the photovoltaic installation is subject to light incidence with an incidence intensity that varies over time and spatially; and a processing unit configured to determine a relative spatial arrangement of the different photovoltaic module groups with respect to one another by comparing sequences of measured values associated with different photovoltaic module groups, wherein comparing the sequences of measured values further comprises determining time shifts between the sequences of measured values of the different photovoltaic module groups.

* * * * *